United States Patent
Li

(10) Patent No.: US 12,310,144 B2
(45) Date of Patent: May 20, 2025

(54) METHOD OF MANUFACTURING DISPLAY MODULE WITH LIGHT EMITTING DIODE FREE OF A SPLIT-SCREEN BOUNDARY LINE AND DISPLAY MODULE WITH LIGHT EMITTING DIODE

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventor: Cheng-Jia Li, Qinhuangdao (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 609 days.

(21) Appl. No.: 17/555,693

(22) Filed: Dec. 20, 2021

(65) Prior Publication Data

US 2023/0155055 A1     May 18, 2023

(30) Foreign Application Priority Data

Nov. 16, 2021   (CN) ......................... 202111357551.X

(51) Int. Cl.
*H01L 25/075* (2006.01)
*H10H 20/01* (2025.01)
(Continued)

(52) U.S. Cl.
CPC ......... *H10H 20/01* (2025.01); *H01L 25/0753* (2013.01); *H10H 20/857* (2025.01);
(Continued)

(58) Field of Classification Search
CPC ......... H01L 25/0753; H01L 2933/0066; H01L 2933/0075; H01L 33/005; H01L 33/62;
(Continued)

(56) References Cited

U.S. PATENT DOCUMENTS

| 2006/0263003 | A1* | 11/2006 | Asai | .......................... | G02B 6/43 |
| | | | | | 257/E31.127 |
| 2007/0223935 | A1* | 9/2007 | Asai | .......................... | G02B 6/43 |
| | | | | | 398/164 |

(Continued)

FOREIGN PATENT DOCUMENTS

| CN | 104166188 A | 11/2014 |
| TW | I740579 B | 9/2021 |

*Primary Examiner* — Meiya Li
(74) *Attorney, Agent, or Firm* — ScienBiziP, P.C.

(57) ABSTRACT

A method of manufacturing a display module which is able to present a split-screen display without a black line prominent at the boundary includes: providing a first circuit substrate including a plurality of first pads, providing a second circuit substrate including a plurality of second pads; bonding the first circuit substrate and the second circuit sub state onto a surface of a heat dissipation plate through a first heat conductive adhesive; and mounting a plurality of light emitting diodes onto the first conductive wiring layer and the third conductive wiring layer, where one light emitting diodes is electrically connected to two first pad, one light emitting diode is electrically connected to one first pad and one second pad, and one light emitting diode is electrically connected to two second pads. A display module including light emitting diodes is also disclosed.

18 Claims, 8 Drawing Sheets

(51) Int. Cl.
  *H10H 20/857*    (2025.01)
  *H10H 20/858*    (2025.01)
(52) U.S. Cl.
  CPC ..... *H10H 20/8582* (2025.01); *H10H 20/0364* (2025.01); *H10H 20/0365* (2025.01)
(58) Field of Classification Search
  CPC .. H01L 33/642; H10H 20/01; H10H 20/0364; H10H 20/0365; H10H 20/857; H10H 20/8582
  See application file for complete search history.

(56) References Cited

U.S. PATENT DOCUMENTS

| | | |
|---|---|---|
| 2013/0113016 A1 | 5/2013 | West |
| 2022/0189907 A1* | 6/2022 | Nam ........................ H01L 25/18 |
| 2023/0187374 A1* | 6/2023 | Jian ........................ H01Q 1/526 257/224 |

* cited by examiner

METHOD OF MANUFACTURING DISPLAY MODULE WITH LIGHT EMITTING DIODE FREE OF A SPLIT-SCREEN BOUNDARY LINE AND DISPLAY MODULE WITH LIGHT EMITTING DIODE

FIELD

The subject matter herein generally relates to display modules, in particular to a display module with light emitting diodes and a method of manufacturing the same.

BACKGROUND

A liquid crystal display (LCD) with mini LEDs as backlighting is better than a LCD display with ordinary LEDs, in terms of brightness, contrast ratio, and color restoration. However, the brightness uniformity of the display screen with mini LEDs is poor, and erratic display may occur. In addition, when a single large display screen is split into two display screens, the mini LEDS may form a black line at the division of the screen.

BRIEF DESCRIPTION OF THE DRAWINGS

Implementations of the present technology will now be described, by way of embodiment, with reference to the attached figures.

DETAILED DESCRIPTION

Implementations of the disclosure will now be described, by way of embodiments only, with reference to the drawings. The disclosure is illustrative only, and changes may be made in the detail within the principles of the present disclosure. It will, therefore, be appreciated that the embodiments may be modified within the scope of the claims.

Unless otherwise defined, all technical terms used herein have the same meaning as commonly understood by one of ordinary skill in the art. The technical terms used herein are to provide a thorough understanding of the embodiments described herein, but are not to be considered as limiting the scope of the embodiments.

A method of manufacturing a display module with light emitting diodes is provided by way of example, as there are a variety of ways to carry out the method. The method can begin at step 11.

Figure 1:
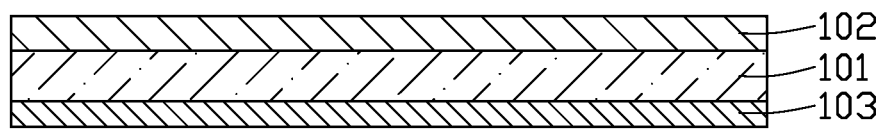
FIG. 1 is a cross-sectional view of an embodiment of a copper clad laminate according to the present disclosure.

At step 11, referring to FIG. 1, a copper clad laminate 10 is provided.

The copper clad laminate 10 includes a first base layer 101 having two opposite surfaces each with a copper foil layer, being first copper foil layer 102 and second copper foil layer 103.

The first base layer 101 is made of a resin which may be selected from a group consisting of epoxy resin, polypropylene, polyphenylene oxide, polyimide, polyethylene terephthalate, polyethylene naphthalate, and any combination thereof. In one embodiment, the first base layer 101 is made of polyimide.

It is to be noted, in some embodiments, the first base layer 101 may be provided with a plurality of conductive wiring layers (not shown) therein.

Figure 2:
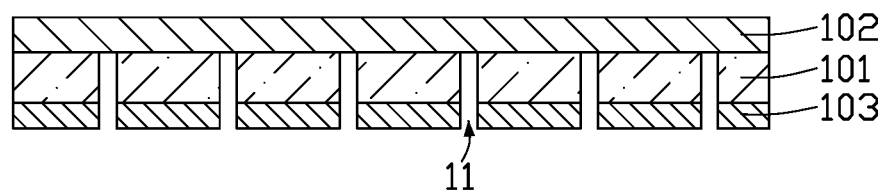
FIG. 2 is a cross-sectional view showing a first blind hole formed on the copper clad laminate of FIG. 1.

At step 12, referring to FIG. 2, a plurality of first blind holes 11 are defined on the copper clad laminate 10.

Each of the first blind holes 11 penetrates the second copper foil layer 103 and the first base layer 101, and portions of the first copper foil layer 102 are exposed in the first blind holes 11.

Figure 3:
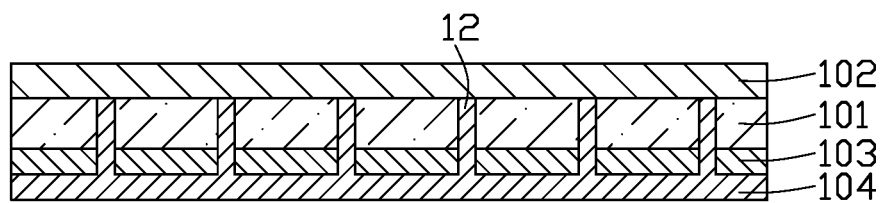
FIG. 3 is a cross-sectional view showing a copper plating layer formed on a second copper foil of the copper clad laminate of FIG. 2.

At step 13, referring to FIG. 3, the second copper foil layer 103 is plated with copper to form a copper plating layer 104. The process of copper plating infills copper into the first blind holes 11 to form first heat conductive portions 12.

Figure 4:
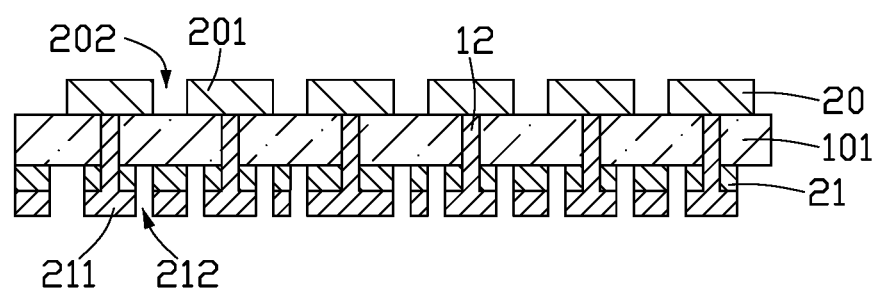
FIG. 4 is a cross-sectional view showing a first copper foil and a second copper foil of the copper clad laminate of FIG. 3 being etched to form a first conductive wiring layer and a second conductive wiring layer.

At step 14, referring to FIG. 4, the first copper foil layer 102 is etched to form a first conductive wiring layer 20, and the second copper foil layer 103 is etched to form a second conductive wiring layer 21.

The first conductive wiring layer 20 includes a plurality of first pads 201, and the second conductive wiring layer 21 includes a plurality of third pads 211. First gaps 202 are formed in the first conductive wiring layer 20, and two adjacent first pads 201 are separated from each other by one first gap 202. Third gaps 212 are formed in the second conductive wiring layer 21, and two adjacent third pads 211 are separated from each other by one third gap 212.

The first conductive wiring layer 20 can be thermally conductive with the second conductive wiring layer 21 through the first heat conductive portions 12. In addition, the first conductive wiring layer 20 can also be electrically connected to the second conductive wiring layer 21 through the first heat conductive portions 12.

Figure 5:
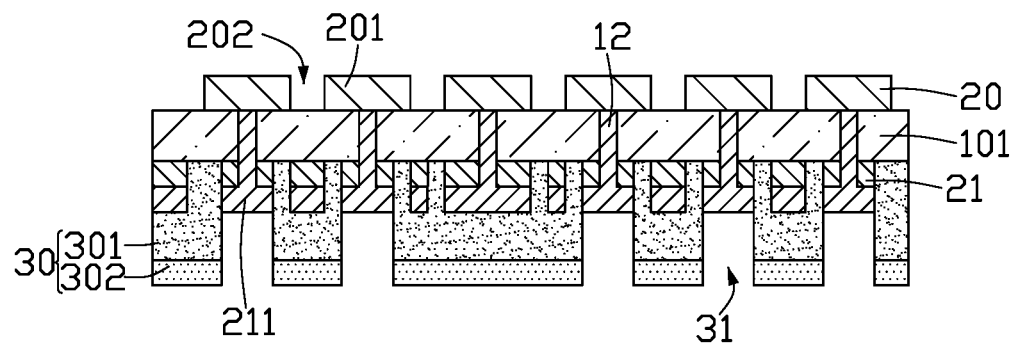
FIG. 5 is a cross-sectional view showing a first cover film formed on the second conductive wiring layer of FIG. 4.

At step 15, referring to FIG. 5, a first cover film 30 is formed on the second conductive wiring layer 21.

The first cover film 30 includes a first adhesive layer 301 arranged on the second conductive wiring layer 21 and a first protective layer 302 arranged on the first adhesive layer 301. The first cover film 30 defines third through holes 31, the third pads 211 being exposed in the third through holes 31. A material of the first adhesive layer 301 may be non-conductive glue.

Figure 6:
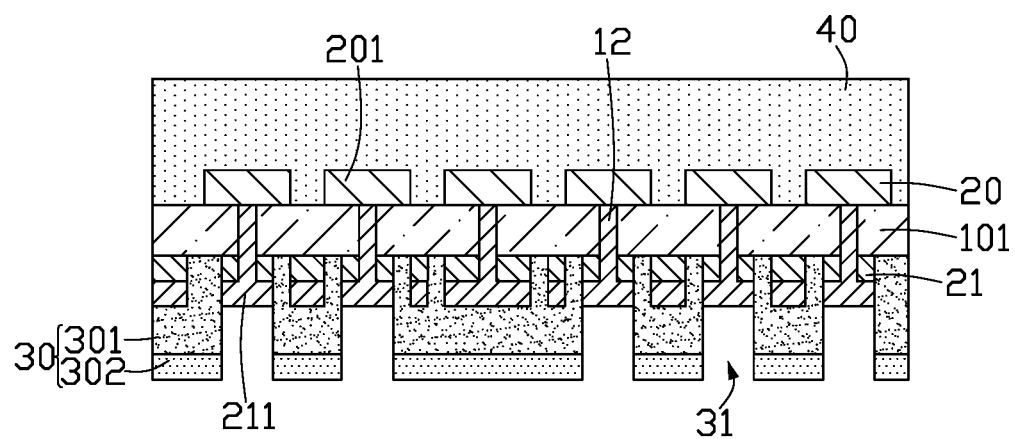
FIG. 6 is a cross-sectional view showing photosensitive ink layer formed on the first conductive wiring layer of FIG. 5.

At step 16, referring to FIG. 6, a photosensitive ink layer 40 is formed on the first conductive wiring layer 20. The photosensitive ink layer 40 also infills the first gaps 202.

Figure 7:
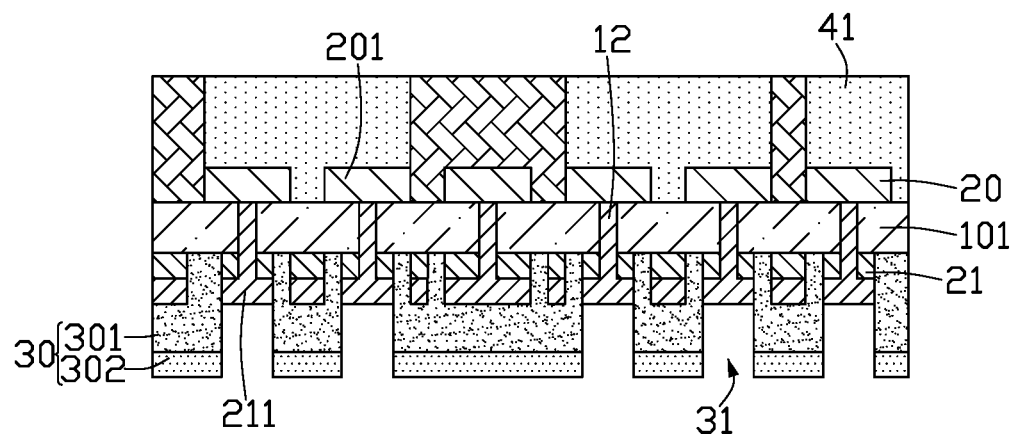
FIG. 7 is a cross-sectional view showing the photosensitive ink layer of FIG. 6 subjected to exposure to form a photosensitive midbody.

At step 17, referring to FIG. 7, the photosensitive ink layer 40 is subjected to exposure to from a photosensitive midbody 41. Specifically, part of the photosensitive ink layer 40 is polymerized and cured under the action of ultraviolet light, while the other part of the photosensitive ink layer 40 is shielded against ultraviolet light and is not polymerized (i.e. it is uncured).

Figure 8:
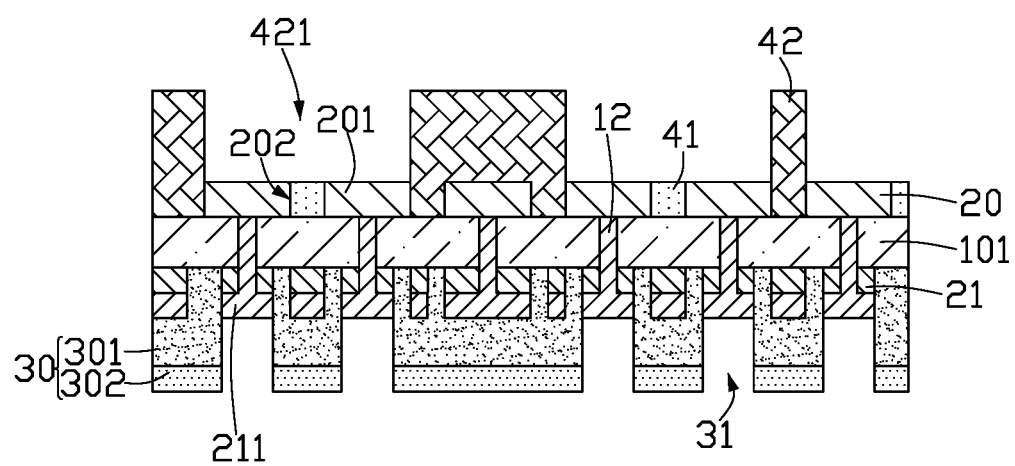
FIG. 8 is a cross-sectional view showing an uncured portion of the photosensitive midbody on the first conductive wiring layer of FIG. 7 being removed.

At step 18, referring to FIG. 8, the uncured portion of the photosensitive midbody 41 on the first conductive wiring layer 20 is removed, thereby forming a first patterned ink layer 42 from the photosensitive midbody 41. Specifically, the uncured portion of the photosensitive midbody 41 on the first conductive wiring layer 20 may be removed by mechanical cutting.

Referring to FIG. 8, some of the uncured portions of the photosensitive midbody 41 are arranged in some of the first gaps 202. That is, some of the first gaps 202 are provided with the photosensitive ink layer 40. The first patterned ink layer 42 includes a plurality of first through holes 421, and the first pads 201 are exposed in the first through holes 421.

Figure 9:
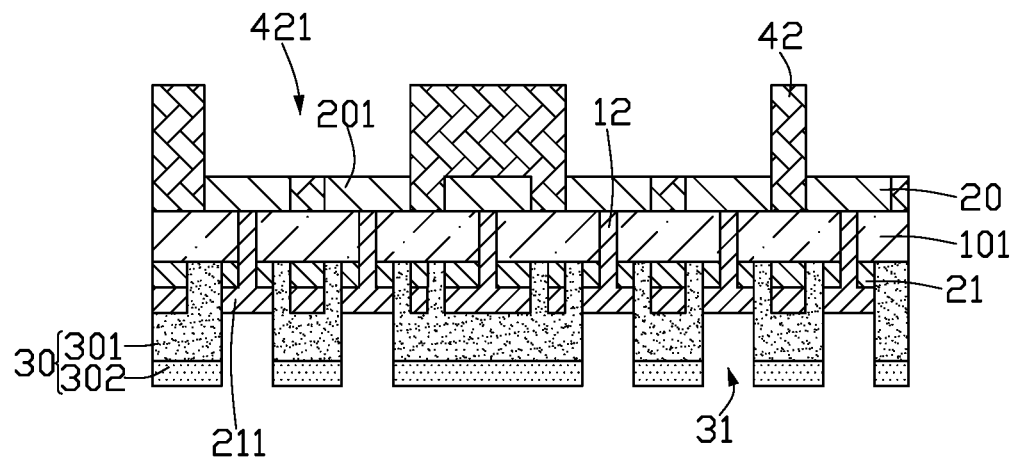
FIG. 9 is a cross-sectional view showing the photosensitive ink layer in a first gap of FIG. 8 subjected to exposure.

At step 19, referring to FIGS. 8 and 9, the portion of the photosensitive ink layer 40 in the first gaps 202 is subjected to exposure and thus polymerized and cured.

Figure 10:
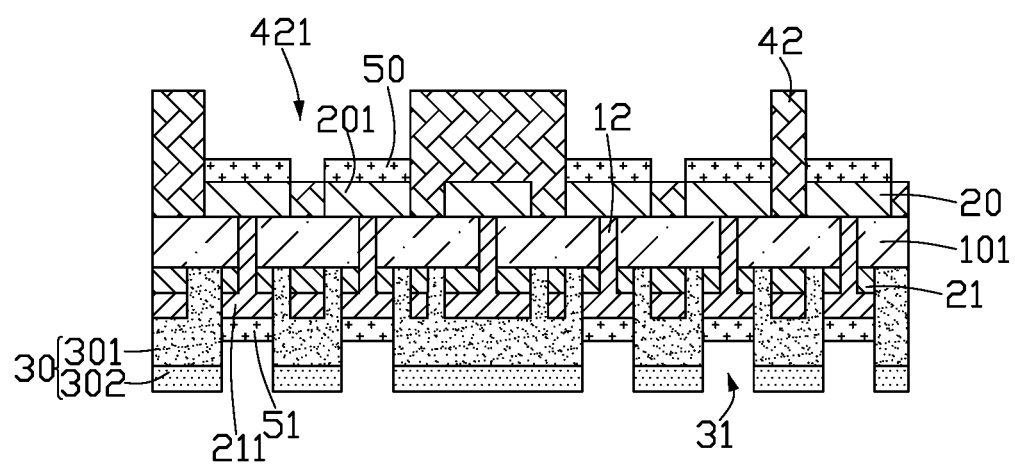
FIG. 10 is a cross-sectional view showing a first surface treatment layer and a third surface treatment layer respectively formed on a first pad and a third pad of FIG. 9.

At step 20, referring to FIG. 10, a first surface treatment layer 50 is formed on the first pads 201 and a third surface treatment layer 51 is formed on the third pads 211, thereby obtaining a first circuit substrate 52. The first surface treatment layer 50 and the third surface treatment layer 51 each can be a layer of gold.

Figure 11:
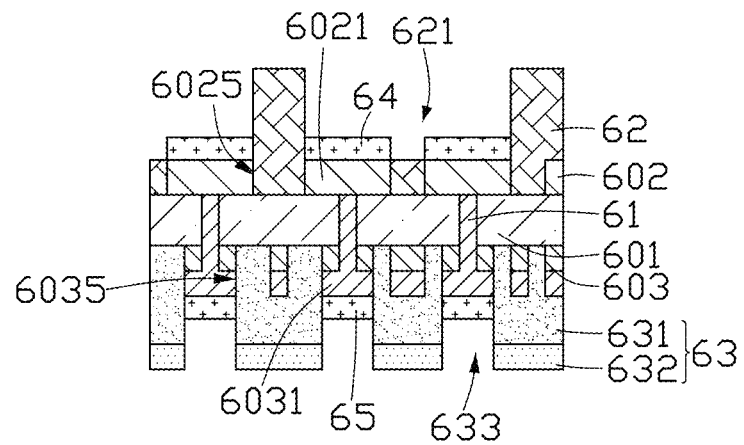
FIG. 11 is a cross-sectional view showing an embodiment of a second circuit substrate.

At step 21, referring to FIG. 11, a second circuit substrate 60 is provided.

The second circuit substrate 60 includes a second base layer 601 including two opposite surfaces and a third conductive wiring layer 602 and a fourth conductive wiring layer 603 arranged on the two opposite surfaces.

It is to be noted, in some embodiments, the second circuit substrate 60 may be provided with conductive wiring layers (not shown) therein. A material of the second base layer 601 is the same as that of the first base layer 101.

The third conductive wiring layer 602 includes a plurality of second pads 6021, and the fourth conductive wiring layer 603 includes a plurality of fourth pads 6031. The third conductive wiring layer 602 includes a plurality of second gaps 6025 separating the second pads 6021 from each other. The fourth conductive wiring layer 603 includes a plurality of fourth gaps 6035 separating each of the fourth pads 6031.

The second circuit substrate 60 includes second heat conductive portions 61. The third conductive wiring layer 602 can be thermally conductive with the fourth conductive wiring layer 603 through the second heat conductive portions 61. In addition, the third conductive wiring layer 602 can also be electrically connected to the fourth conductive wiring layer 603 through the second heat conductive portions 61.

The second circuit substrate 60 further includes a second patterned ink layer 62. The second patterned ink layer 62 is arranged on the third conductive wiring layer 62, and a portion of the second patterned ink layer 62 infills the second gaps 6025. The second patterned ink layer 62 includes a plurality of second through holes 621, and the second pads 6021 are exposed in the second through holes 621.

The second circuit substrate 60 further includes a second cover film 63. The second cover film 63 includes a second adhesive layer 631 arranged on the fourth conductive wiring layer 603 and a second protective layer 632 arranged on the second adhesive layer 631. The second adhesive layer 631 can be made of non-conductive glue.

The second cover film 63 includes a plurality of fourth through holes 633, and the fourth pads 6031 are exposed in the fourth through holes 633.

The second circuit substrate 60 further includes a second surface treatment layer 64 and a fourth surface treatment layer 65. The second surface treatment layer 64 is arranged on the second pads 6021, and the fourth surface treatment layer 65 is arranged on the fourth pads 6031. The second surface treatment layer 64 and the fourth surface treatment layer 65 each may be a layer of gold.

Figure 12:
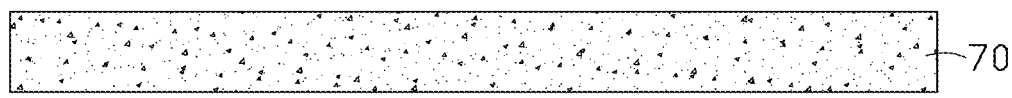
FIG. 12 is a cross-sectional view showing an embodiment of a first heat conductive adhesive and a heat dissipation plate.
Figure 12:

At step 22, referring to FIG. 12, a first heat conductive adhesive 70 and a heat dissipation plate 71 are provided.

The heat dissipation plate 71 may be an aluminum plate. In some embodiments, the heat dissipation plate 71 may also be a copper plate or an iron plate.

Figure 13:
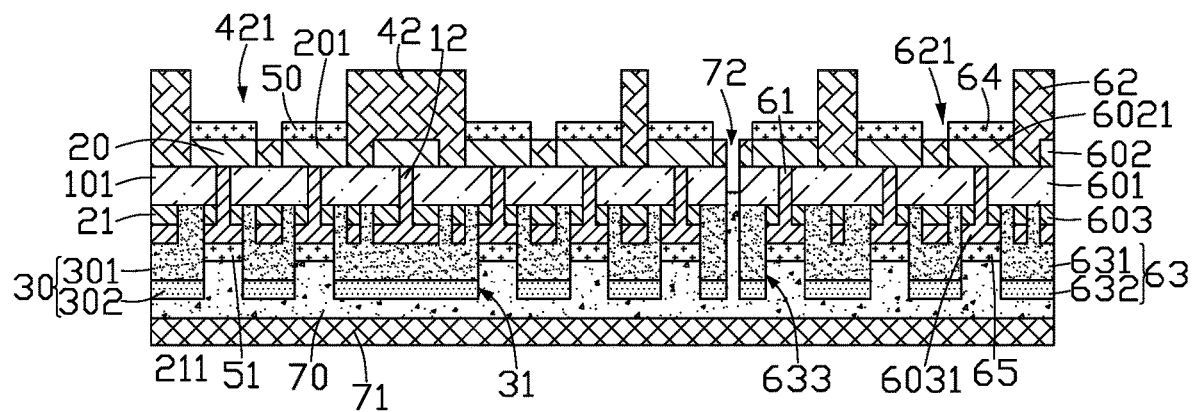
FIG. 13 is a cross-sectional view showing the first circuit substrate of FIG. 10 and the second circuit substrate of FIG. 11 being bond to the heat dissipation plate through the first heat conductive adhesive of FIG. 12.

At step 23, referring to FIG. 13, the first circuit substrate 52 and the second circuit substrate 60 are each bonded to a surface of the heat dissipation plate 71 through the first heat conductive adhesive 70, and the first heat conductive adhesive 70 infills a gap 72 between an end face of the first circuit substrate 52 and an end face of the second circuit substrate 60.

The first heat conductive adhesive 70 further infills the third through holes 31 to be thermally conductive with the third surface treatment layer 51, and thus to be thermally conductive with the second conductive wiring layer 21, the first heat conductive portions 12, and the first conductive wiring layer 20. The first conductive wiring layer 20, the first heat conductive portions 12, the second conductive wiring layer 21, the first heat conductive adhesive 70, and the heat dissipation plate 71 together form a first heat dissipation channel.

The first heat conductive adhesive 70 further infills the fourth through holes 633 to be thermally conductive with the fourth surface treatment layer 65, and so as to be thermally conductive with the fourth conductive wiring layer 603, the second heat conductive portions 61, and the third conductive wiring layer 602. The third conductive wiring layer 602, the second heat conductive portions 61, the fourth conductive wiring layer 603, the first heat conductive adhesive 70, and the heat dissipation plate 71 together form a second heat dissipation channel.

Figure 14:
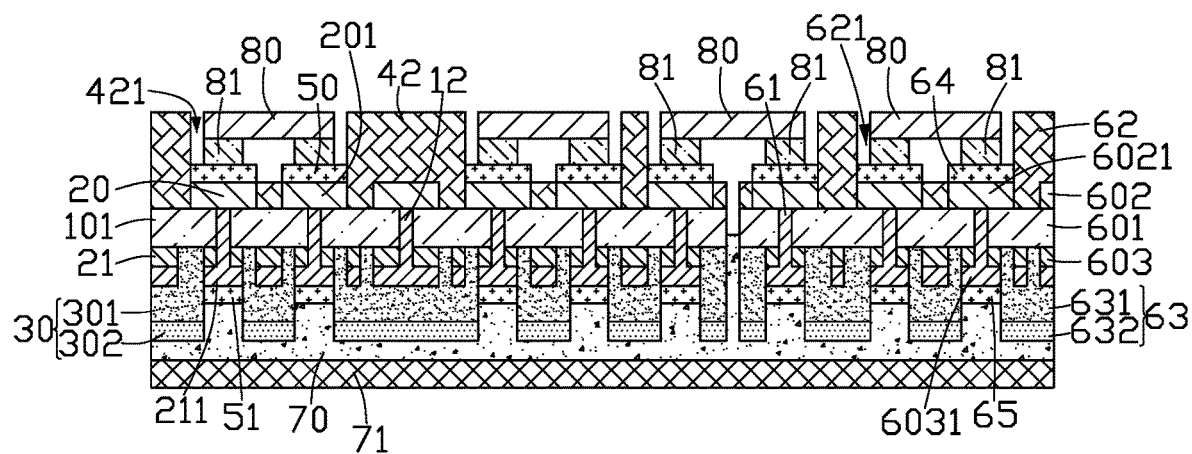
FIG. 14 is a cross-sectional view showing a plurality of light emitting diodes arranged on the first conductive wiring layer and the third conductive wiring layer of FIG. 13.

At step 24, referring to FIG. 14, the first conductive wiring layer 20 and the third conductive wiring layer 602 are each provided with a plurality of light emitting diodes 80, at least one light emitting diode 80 is electrically connected to the first pads 201, at least one light emitting diode 80 is electrically connected to the first pads 201 and the second pads 6021, and at least one light emitting diode 80 is electrically connected to the second pads 6021.

Each of the light emitting diodes 80 includes a main body (not shown) and a first electrode (not shown) and a second electrode (not shown) electrically connected to the main body.

The light emitting diodes 80 arranged on the first conductive wiring layer 20 are received in the first through holes 421, and the light emitting diodes 80 arranged on the third conductive wiring layer 602 are received in the second through holes 621.

Referring to FIG. 14, the first electrode and the second electrode of the light emitting diodes 80 arranged on the first conductive wiring layer 20 are electrically connected to the first surface treatment layer 50 via a plurality of conductive elements 81. Thus each of the light emitting diodes 80 on the first conductive wiring layer 20 is electrically connected to the first pads 201, the first conductive wiring layer 20, and the second conductive wiring layer 21. The first electrode and the second electrode of the light emitting diodes 80 arranged on the third conductive wiring layer 602 are electrically connected to the second surface treatment layer 64 via a plurality of conductive elements 81. Thereby each of the light emitting diodes 80 on the third conductive wiring layer 602 is electrically connected to the second pads 6021, the third conductive wiring layer 602, and the fourth conductive wiring layer 603. The first electrode and the second electrode of the light emitting diodes 80 arranged on the first conductive wiring layer 20 and the third conductive wiring layer 602 are respectively electrically connected to the first surface treatment layer 50 and the second surface treatment layer 64 via a plurality of conductive elements 81, thus electrically connected to the first pad 201 and the second pad 6021, and thereby being electrically connected to the first conductive wiring layer 20, the second conductive wiring layer 21, the third conductive wiring layer 602, and the fourth conductive wiring layer 603. That is, at least one of the light emitting diodes 80 is located on the first conductive wiring layer 20 and the third conductive wiring layer 602.

In some embodiments, the conductive elements 81 may be conductive paste. Specifically, the conductive paste can be solder paste, copper paste, etc. The conductive members 81 have a high thermal conductivity.

Figure 15:
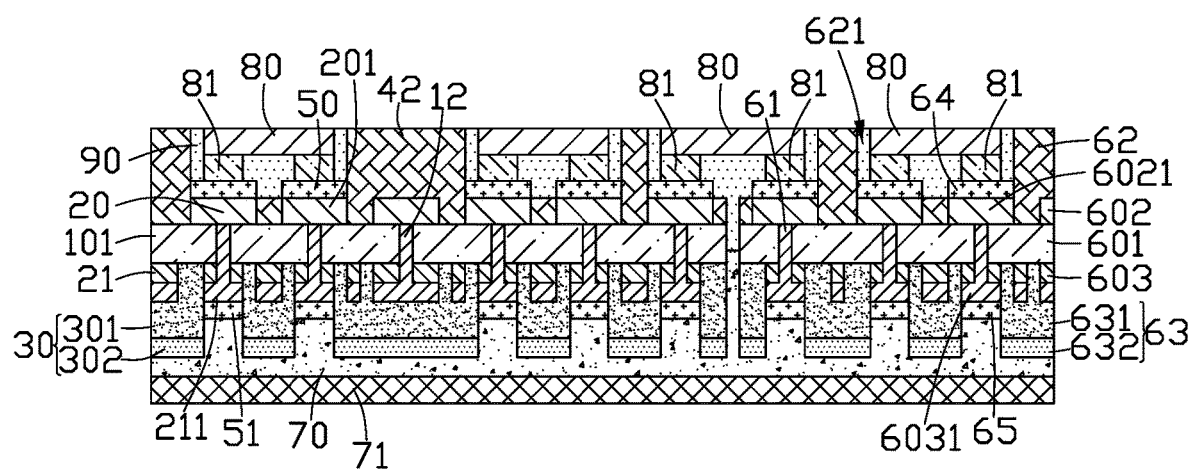
FIG. 15 is a cross-sectional view showing an embodiment of a display module.

At step 25, referring to FIGS. 14 and 15, the first through holes 421 and the second through holes 621 are filled with second heat conductive adhesive 90, thereby obtaining the display module 100.

A surface of each of the light emitting diodes 80 away from the heat dissipation plate 71 is lower than or flush with a surface of the first patterned ink layer 42 or the second patterned ink layer 62 away from the heat dissipation plate 71, so as to improve the flatness of the display module 100.

The heat generated by the light emitting diodes 80 located on the first conductive wiring layer 20 is transmitted to the first heat dissipation channel through the conductive members 81 and the second heat conductive adhesive 90, and to an external environment through the first heat dissipation channel. The heat generated by the light emitting diodes 80 located on the third conductive wiring layer 602 is transmitted to the second heat dissipation channel through the conductive members 81 and the second heat conductive adhesive 90, and to the external environment through the second heat dissipation channel. At the same time, the heat generated by the light emitting diodes 80 located on the first conductive wiring layer 20 and the third conductive wiring layer 602 is transmitted to the first heat dissipation channel and the second heat dissipation channel through the conductive members 81 and the second heat conductive adhesive 90, and to the external environment through the first heat dissipation channel and the second heat dissipation channel.

Referring to FIGS. 13 to 15, the second heat conductive adhesive 90 further infills the gap 72 and makes contact with the first heat conductive adhesive 70. Heat generated by the light emitting diodes 80 located on the first conductive wiring layer 20 and the third conductive wiring layer 602 is transmitted to the external environment through the second heat conductive adhesive 90, the first heat conductive adhesive 70, and the heat dissipation plate 71.

Referring to FIG. 15, an embodiment of the present disclosure provides the display module 100 which includes a first circuit substrate 52, a second circuit substrate 60, a heat dissipation plate 71, a first heat conductive adhesive 70, a plurality of light emitting diodes 80, and a second heat conductive adhesive 90.

The first circuit substrate 52 includes a first base layer 101 having two opposite surfaces and a first copper foil layer 102 and a second copper foil layer 103 formed on the surfaces.

The first base layer 101 is made of a resin which may be selected from a group consisting of epoxy resin, polypropylene, polyphenylene oxide, polyimide, polyethylene terephthalate, polyethylene naphthalate, and any combination thereof. In one embodiment, the first base layer 101 is made of polyimide.

It is to be noted, in some embodiments, the first base layer 101 may be provided with a plurality of conductive wiring layers (not shown) therein.

The first conductive wiring layer 20 includes a plurality of first pads 201, and the second conductive wiring layer 21 includes a plurality of third pads 211. A plurality of first gaps 202 are formed in the first conductive wiring layer 20, and adjacent first pads 201 are separated from each other by one first gap 202. A plurality of third gaps 212 are formed in the second conductive wiring layer 21, and adjacent third pads 211 are separated from each other by one third gap 212.

The first circuit substrate 52 further includes a plurality of first heat conductive portions 12. The first conductive wiring layer 20 is thermally conductive with the second conductive wiring layer 21 through the first heat conductive portions 12. In addition, the first conductive wiring layer 20 can also be electrically connected to the second conductive wiring layer 21 through the first heat conductive portions 12.

The first circuit substrate 52 further includes a first cover film 30. The first cover film 30 includes a first adhesive layer 301 arranged on the second conductive wiring layer 21 and a first protective layer 302 arranged on the first adhesive layer 301. The first cover film 30 defines a plurality of third through holes 31, and the third pads 211 are exposed in the third through holes 31. A material of the first adhesive layer 301 may be pure glue.

The first circuit substrate 52 further includes a first patterned ink layer 42. The first patterned ink layer 42 is arranged on the first conductive wiring layer 20, where a portion of the first patterned ink layer 42 infills some of the first gaps 202. The first patterned ink layer 42 includes a plurality of first through holes 421, and the first pads 201 are exposed in the first through holes 421.

The first circuit substrate 52 further includes a first surface treatment layer 50 and a third surface treatment layer 51. The first surface treatment layer 50 is arranged on the first pads 201, and the third surface treatment layer 51 is arranged on the third pads 211. In one embodiment, the first surface treatment layer 50 and the third surface treatment layer 51 each can be a gold layer.

The second circuit substrate 60 includes a second base layer 601 including two opposite surfaces and a third conductive wiring layer 602 and a fourth conductive wiring layer 603 arranged on the surfaces.

It is to be noted, in some embodiments, the second circuit substrate 60 may be provided with a plurality of conductive wiring layers (not shown) therein. A material of the second base layer 601 may be the same as that of the first base layer 101.

The third conductive wiring layer 602 includes a plurality of second pads 6021, and the fourth conductive wiring layer 603 includes a plurality of fourth pads 6031. The third conductive wiring layer 602 includes a plurality of second gaps 6025 separating the second pads 6021 from each other. The fourth conductive wiring layer 603 includes a plurality of fourth gaps 6035 separating the fourth pads 6031 from each other.

The second circuit substrate 60 includes a plurality of second heat conductive portions 61. The third conductive wiring layer 602 is thermally conductive with the fourth conductive wiring layer 603 through the second heat conductive portions 61. In addition, the third conductive wiring layer 602 can also be electrically connected to the fourth conductive wiring layer 603 the second heat conductive portions 61.

The second circuit substrate 60 further includes a second patterned ink layer 62. The second patterned ink layer 62 is arranged on the third conductive wiring layer 62, and a portion of the second patterned ink layer 62 infills the second gaps 6025. The second patterned ink layer 62 includes a plurality of second through holes 621, and the second pads 6021 are exposed in the second through holes 621.

The second circuit substrate 60 further includes a second cover film 63. The second cover film 63 includes a second adhesive layer 631 arranged on the fourth conductive wiring layer 603 and a second protective layer 632 arranged on the second adhesive layer 631. The second adhesive layer 631 can be made of non-conductive glue.

The second cover film 63 includes a plurality of fourth through holes 633, and the fourth pads 6031 are exposed in the fourth through holes 633.

The second circuit substrate 60 further includes a second surface treatment layer 64 and a fourth surface treatment layer 65. The second surface treatment layer 64 is arranged on the second pads 6021, and the fourth surface treatment layer 65 is arranged on the fourth pads 6031. The second surface treatment layer 64 and the fourth surface treatment layer 65 each may be a gold layer.

The first circuit substrate 52 and the second circuit substrate 52 are each arranged on the heat dissipation plate 71. The heat dissipation plate 71 may be an aluminum plate. In some embodiments, the heat dissipation plate 71 may also be a copper plate or an iron plate.

The first heat conductive adhesive 70 is arranged between the first circuit substrate 52 and the heat dissipation plate 71 and between the second circuit substrate 60 and the heat dissipation plate 71. The first heat conductive adhesive 70 further infills a gap 72 between an end face of the first circuit substrate 52 and an end face of the second circuit substrate 60.

The first heat conductive adhesive 70 further infills the third through holes 31 to be thermally conductive with the third surface treatment layer 51, and thus to be thermally conductive with the second conductive wiring layer 21, the first heat conductive portions 12, and the first conductive wiring layer 20. The first conductive wiring layer 20, the first heat conductive portions 12, the second conductive wiring layer 21, the first heat conductive adhesive 70, and the heat dissipation plate 71 together form a first heat dissipation channel.

The first heat conductive adhesive 70 further infills the fourth through holes 633 to be thermally conductive with the fourth surface treatment layer 65, and so as to be thermally conductive with the fourth conductive wiring layer 603, the second heat conductive portions 61, and the third conductive wiring layer 602. The third conductive wiring layer 602, the second heat conductive portions 61, the fourth conductive wiring layer 603, the first heat conductive adhesive 70, and the heat dissipation plate 71 together form a second heat dissipation channel.

The first conductive wiring layer 20 and the third conductive wiring layer 602 are each provided with a plurality of light emitting diodes 80, at least one light emitting diode 80 is electrically connected to the first pads 201, at least one light emitting diode 80 is electrically connected to the first pads 201 and the second pads 6021, and at least one light emitting diode 80 is electrically connected to the second pads 6021.

Each of the light emitting diodes 80 includes a main body (not shown) and a first electrode (not shown) and a second electrode (not shown) electrically connected to the main body.

The light emitting diodes 80 arranged on the first conductive wiring layer 20 are received in the first through holes 421, and the light emitting diodes 80 arranged on the third conductive wiring layer 602 are received in the second through holes 621.

The first electrode and the second electrode of the light emitting diode 80 arranged on the first conductive wiring layer 20 are electrically connected to the first surface treatment layer 50 via conducting elements 81. Thus the light emitting diode 80 on the first conductive wiring layer 20 is electrically connected to the first pads 201, the first conductive wiring layer 20, and the second conductive wiring layer 21. The first electrode and the second electrode of the light emitting diode 80 arranged on the third conductive wiring layer 602 are electrically connected to the second surface treatment layer 64 via the conductive elements 81. Thus the light emitting diode 80 on the third conductive wiring layer 602 is electrically connected to the second pads 6021, the third conductive wiring layer 602, and the fourth conductive wiring layer 603. The first electrode and the second electrode of the light emitting diode 80 arranged on the first conductive wiring layer 20 and the third conductive wiring layer 602 are respectively electrically connected to the first surface treatment layer 50 and the second surface treatment layer 64 via the conductive elements 81, thus to be respectively electrically connected to the first pad 201 and the second pad 6021, thereby being electrically connected to the first conductive wiring layer 20, the second conductive wiring layer 21, the third conductive wiring layer 602, and the fourth conductive wiring layer 603. That is, at least one of the light emitting diodes 80 is located on the first conductive wiring layer 20 and the third conductive wiring layer 602.

The second heat conductive adhesive 90 infills the first through holes 421 and the second through holes 621. A surface of each of the light emitting diodes 80 away from the heat dissipation plate 71 is lower than or flush with a surface of the first patterned ink layer 42 or the second patterned ink layer 62 away from the heat dissipation plate 71, so as to improve the flatness of the display module 100.

The heat generated by the light emitting diodes 80 located on the first conductive wiring layer 20 is transmitted to the first heat dissipation channel through the conductive members 81 and the second heat conductive adhesive 90, and to an external environment through the first heat dissipation channel. The heat generated by the light emitting diodes 80 located on the third conductive wiring layer 602 is transmitted to the second heat dissipation channel through the conductive members 81 and the second heat conductive adhesive 90, and to the external environment through the second heat dissipation channel. At the same time, the heat generated by the light emitting diodes 80 located on the first conductive wiring layer 20 and the third conductive wiring layer 602 is transmitted to the first heat dissipation channel and the second heat dissipation channel through the conductive members 81 and the second heat conductive adhesive 90, and to the external environment through the first heat dissipation channel and the second heat dissipation channel.

The second heat conductive adhesive 90 further infills the gap 72 to make contact with the first heat conductive adhesive 70. Heat generated by the light emitting diodes 80 located on the first conductive wiring layer 20 and the third conductive wiring layer 602 can be transmitted to the external environment through the second heat conductive adhesive 90, the first heat conductive adhesive 70, and the heat dissipation plate 71.

After the first circuit substrate 52 and the second circuit substrate 60 are adhered to the heat dissipation plate 71 by the first heat conductive adhesive 70, the light emitting diodes 80 are respectively mounted onto the first conductive wiring layer 20 and the third conductive wiring layer 602, so that the flatness of the light emitting diodes 80 is improved, the probability of inclination of the light emitting diodes 80 is decreased, the uniformity of light emission of the light emitting diodes 80 is improved, and uniformity of brightness and color of the display module 100 is improved. In addition, at least one of the light emitting diodes 80 is disposed on a boundary between the first circuit substrate 52 and the second circuit substrate 60, so that a black line present at the boundary is reduced or canceled, and the display quality of the display module 100 is improved.

In addition, the heat generated by the light emitting diodes 80 can be transmitted to the first heat dissipation channel or the second heat dissipation channel through the conductive members 81 and the second heat conductive adhesive 90, and to the external environment through the first heat dissipation channel or the second heat dissipation channel, so that the heat dissipation performance of the display module 100 is improved. The adjacent light-emitting diodes 80 are separated by the first patterned ink layer 42 or by the second patterned ink layer 62, such that heat generated by the two adjacent light emitting diodes 80 dissipate heat separately and independently, without mutual influence, so that heat is not accumulated.

In addition, the first through holes 421 and the second through holes 621 are infilled with the second heat conductive adhesive 90 separately, the stability of the light emitting diodes 80 is improved, thereby improving the reliability of the display module 100.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A method of manufacturing a display module, comprising:
    providing a first circuit substrate, the first circuit substrate comprising a first base layer, a first conductive wiring layer, and a second conductive wiring layer, the first conductive wiring layer and the second conductive wiring layer being arranged on two opposite surfaces of the first base layer, the first conductive wiring layer comprising a plurality of first pads;
    providing a second circuit substrate, the second circuit substrate comprising a second base layer, a third conductive wiring layer, and a fourth conductive wiring layer, the third conductive wiring layer and the fourth conductive wiring layer being arranged on two opposite surfaces of the second base layer, the third conductive wiring layer comprising a plurality of second pads;
    bonding the first circuit substrate and the second circuit substrate onto a surface of a heat dissipation plate through a first heat conductive adhesive, wherein the first heat conductive adhesive infills a gap between an end face of the first circuit substrate and an end face of the second circuit substrate; and
    mounting a plurality of light emitting diodes onto the first conductive wiring layer and the third conductive wiring layer respectively, wherein a first one of the plurality of light emitting diodes is electrically connected to two a first one and a second one of the plurality of first pads, a second one of the plurality of light emitting diodes is electrically connected to a third one of the plurality of first pads and a first one of the plurality of second pads, and a third one of the plurality of light emitting diodes is electrically connected to two a second one and a third one of the plurality of second pads.

2. The method of claim 1, further comprising:
    forming a first heat conductive portion connected to the first conductive wiring layer and the second conductive wiring layer; and
    forming a second heat conductive portion connected to the third conductive wiring layer and the fourth conductive wiring layer;
    wherein the first conductive wiring layer, the first heat conductive portion, the second conductive wiring layer, the first heat conductive adhesive, and the heat dissipation plate constitute a first heat dissipation channel; and
    wherein the third conductive wiring layer, the second heat conductive portion, the fourth conductive wiring layer, the first heat conductive adhesive, and the heat dissipation plate constitute a second heat dissipation channel; heat generated by the plurality of light emitting diodes is transmitted to an external environment through the first heat dissipation channel or the second heat dissipation channel.

3. The method of claim 1, further comprising:
    forming a first patterned ink layer onto the first conductive wiring layer, the first patterned ink layer comprising a plurality of first through holes exposing the plurality of first pads;
    forming a second patterned ink layer onto the third conductive wiring layer, the second patterned ink layer comprising a plurality of second through holes exposing the plurality of second pads;
    wherein the plurality of light emitting diodes are received in the first plurality of through holes or the plurality of second through holes.

4. The method of claim 3, further comprising infilling a second heat conductive adhesive into the plurality of first through holes and the plurality of second through holes.

5. The method of claim 3, wherein a surface of each of the plurality of Light emitting diodes away from the first conductive wiring layer or the third conductive wiring layer is flush with a surface of the first patterned ink layer away from the first conductive wiring layer or a surface of the second patterned ink layer away from the third conductive wiring layer.

6. The method of claim 4, wherein the plurality of the first pads is spaced apart from each other by a first gap, the plurality of the second pads is spaced apart from each other by a second gap, the first patterned ink layer further infills the first gap, and the second patterned ink layer further infills the second gap.

7. The method of claim 1, further comprising:
forming a first surface treatment layer onto the plurality of first pads; and
forming a second surface treatment layer onto the plurality of second pads.

8. The method of claim 1, further comprising forming a plurality of conductive elements electrically connecting the plurality of light emitting diodes to the plurality of first pads and the plurality of second pads.

9. The method of claim 1, further comprising:
forming a first cover film onto the second conductive wiring layer, the first cover film comprising a first adhesive layer arranged on the second conductive wiring layer and a first protective layer arranged on a surface of the first adhesive layer away from the second conductive wiring layer; and
forming a second cover film onto the fourth conductive wiring layer, the second cover film comprising a second adhesive layer arranged on the fourth conductive wiring layer and a second protective layer arranged on a surface of the second adhesive layer away from the fourth conductive wiring layer.

10. A display module, comprising:
a first circuit substrate comprising a first base layer and a first conductive wiring layer and a second conductive wiring layer arranged on two opposite surfaces of the first base layer respectively, the first conductive wiring layer comprising a plurality of first pads;
a second circuit substrate comprising a second base layer and a third conductive wiring layer and a fourth conductive wiring layer arranged on two opposite surfaces of the second base layer respectively, the third conductive wiring layer comprising a plurality of second pads;
a heat dissipation plate, wherein the first circuit substrate and the second circuit substrate are arranged on a surface of the heat dissipation plate;
a first heat conductive adhesive, wherein the first heat conductive adhesive is located between the first circuit substrate and the heat dissipation plate and between the second circuit substrate and the heat dissipation plate, and is infilled in a gap between an end face of the first circuit substrate and an end face of the second circuit substrate; and
a plurality of light emitting diodes arranged on the first conductive wiring layer and the third conductive wiring layer respectively, wherein a first one of the plurality of light emitting diodes is electrically connected to a first one and a second one of the plurality of first pads, a second one of the plurality of light emitting diodes is electrically connected to a third one of the plurality of first pads and a first one of the plurality of second pads, a third one of the plurality of light emitting diodes is electrically connected to a second one and a third one of the plurality of second pads.

11. The display module of claim 10, wherein the first circuit substrate further comprises a first heat conductive portion connected to the first conductive wiring layer and the second conductive wiring layer, the second circuit substrate further comprises a second heat conductive portion connected to the third conductive wiring layer and the fourth conductive wiring layer; the first conductive wiring layer, the first heat conductive portion, the second conductive wiring layer, the first heat conductive adhesive, and the heat dissipation plate constitute a first heat dissipation channel; the third conductive wiring layer, the second heat conductive portion, the fourth conductive wiring layer, the first heat conductive adhesive, and the heat dissipation plate constitute a second heat dissipation channel; heat generated by the plurality of light emitting diodes is transmitted to an external environment through the first heat dissipation channel or the second heat dissipation channel.

12. The display module of claim 10, wherein the first circuit substrate further comprises a first patterned ink layer arranged on the first conductive wiring layer, the first patterned ink layer comprises a plurality of first through holes exposing the plurality of first pads, the second circuit substrate further comprises a second patterned ink layer arranged on the third conductive wiring layer, the second patterned ink layer comprises a plurality of second through holes exposing the plurality of second pads, the plurality of light emitting diodes are received in the plurality of first through holes or the plurality of second through holes.

13. The display module of claim 12, further comprising a second heat conductive adhesive, wherein the plurality of first through holes and the plurality of second through holes are infilled with the second heat conductive adhesive.

14. The display module of claim 12, wherein a surface of each of the plurality of light emitting diodes away from the first conductive wiring layer or the third conductive wiring layer is flush with a surface of the first patterned ink layer away from the first conductive wiring layer or a surface of the second patterned ink layer away from the third conductive wiring layer.

15. The display module of claim 13, wherein the plurality of the first pads is spaced apart from each other by a first gap, the plurality of the second pads is spaced apart from each other by a second gap, the first patterned ink layer further infills the first gap, and the second patterned ink layer further infills the second gap.

16. The display module of claim 10, further comprising a first surface treatment layer arranged on the plurality of first pads and a second surface treatment layer arranged on the plurality of second pads.

17. The display module of claim 10, further comprising a plurality of conductive elements electrically connecting the plurality of light emitting diodes to the plurality of first pads and the plurality of second pads.

18. The display module of claim 10, further comprising a first cover film arranged on the second conductive wiring layer and a second cover film arranged on the fourth conductive wiring layer, wherein the first cover film comprises a first adhesive layer arranged on the second conductive wiring layer and a first protective layer arranged on a surface of the first adhesive layer away from the second conductive wiring layer, the second cover film comprises a second adhesive layer arranged on the fourth conductive wiring layer and a second protective layer arranged on a surface of the second adhesive layer away from the fourth conductive wiring layer.

* * * * *